(12) United States Patent
Salzman

(10) Patent No.: US 8,558,353 B2
(45) Date of Patent: Oct. 15, 2013

(54) INTEGRATED CIRCUIT HAVING AN UPPERMOST LAYER COMPRISING LANDING PADS THAT ARE DISTRIBUTED THOUGHOUT ONE SIDE OF THE INTEGRATED CIRCUIT

(75) Inventor: James F. Salzman, Anna, TX (US)

(73) Assignee: Texas Instruments Incorporated, Dallas, TX (US)

( * ) Notice: Subject to any disclaimer, the term of this patent is extended or adjusted under 35 U.S.C. 154(b) by 701 days.

(21) Appl. No.: 11/559,987

(22) Filed: Nov. 15, 2006

(65) Prior Publication Data

US 2008/0111253 A1 May 15, 2008

(51) Int. Cl.
*H01L 29/40* (2006.01)

(52) U.S. Cl.
USPC ............... 257/621; 257/786; 257/E23.011

(58) Field of Classification Search
USPC ......... 257/758–770, 213–230, 621, 734, 786, 257/E23.011
See application file for complete search history.

(56) References Cited

U.S. PATENT DOCUMENTS

| 6,521,996 | B1 * | 2/2003 | Seshan ........................ 257/737 |
| 6,586,266 | B1 * | 7/2003 | Lin ................................ 438/15 |
| 6,815,254 | B2 * | 11/2004 | Mistry et al. ................ 438/108 |
| 2004/0266159 | A1 * | 12/2004 | Gardecki et al. ............ 438/613 |
| 2006/0022310 | A1 | 2/2006 | Egitto et al. |

OTHER PUBLICATIONS http://www.merriam-webster.com/dictionary/homogeneous.*

* cited by examiner

*Primary Examiner* — Brook Kebede
(74) *Attorney, Agent, or Firm* — Ronald O. Neerings; W. James Brady; Frederick J. Telecky, Jr.

(57) ABSTRACT

An electrical device comprising an integrated circuit (IC) having an uppermost layer that includes landing pads that are distributed throughout one side of the IC.

25 Claims, 15 Drawing Sheets

INTEGRATED CIRCUIT HAVING AN UPPERMOST LAYER COMPRISING LANDING PADS THAT ARE DISTRIBUTED THOUGHOUT ONE SIDE OF THE INTEGRATED CIRCUIT

TECHNICAL FIELD

The present invention is directed to packaging integrated circuits (ICs) and methods for packaging ICs.

BACKGROUND

It is desirable to increase the packing density of ICs, e.g., large-scale integrated (LSI) circuits, in circuit boards because this facilitates the miniaturization of electrical devices. Unfortunately, many IC attachment processes require a redistribution wiring layer (RDL) that redirects interconnects contacting the active components of the IC to bond pads on peripheral locations of IC. Significant resources and board space are devoted to produce and accommodate the RDL. There is a limit, however, to the number of bond pads that can be situated around the periphery of the IC. In some cases, therefore, the IC die is maintained at a certain minimum size simply so that there is enough space for the surrounding bond pads.

Accordingly, what is needed in the art is method to increase the packing density of ICs on a circuit board without the complexities and costs inherent in today's attachment technologies.

SUMMARY

The invention provides in one embodiment, an electrical device. The device comprises an integrated circuit (IC) having an uppermost layer that includes landing pads that are distributed throughout one side of the IC.

Another embodiment is a mobile electrical device that comprises a plurality electronic components mounted to a surface of a base layer and the above-described IC held in an opening of the base layer. The device also comprises conductive lines formed on the base layer and the one side of the IC having the landing pads. The conductive lines contact the landing pads to form an electrical connection between the IC and one or more of said electrical components.

Still another embodiment is a method of manufacturing an electrical device. The method includes fabricating the above-described IC including forming an uppermost layer of the IC, the uppermost layer having landing pads which are distributed throughout one side of the IC.

DRAWINGS

The invention is described with reference to example embodiments and to accompanying drawings, wherein:

FIGS. 1A-1F present cross-sectional views of example electrical devices of the invention;

FIG. 2 illustrates a plan view of the example electrical device shown in FIG. 1A; and FIGS. 3-12 illustrate cross-sectional views of selected steps in an example method of manufacturing an electrical device of the invention.

DETAILED DESCRIPTION

Embodiments of the present invention benefit from the recognition that interconnection metal levels from an IC do not have to be redistributed from bond pads in peripheral locations surrounding the IC using an RDL metal layer. Therefore, the time and expense associated with producing an RDL is avoided. It is further recognized that peripherally located bonding pads on an IC can be dispensed with, or reduced to small test pads. Because there is no need for peripherally located bond pads, the size of the IC can be reduced.

FIGS. 1A-1F present a cross-sectional views of example electrical devices 100 of the invention and FIG. 2 presents a lower-magnification plan view of the device 100 shown in FIG. 1A, all using the same reference numbers. The cross-sectional view shown in FIG. 1A corresponds to view line 1-1 depicted in FIG. 2.

Turning to FIG. 1A, the device 100 comprises an integrated circuit (IC) 105. The IC 105 has an uppermost layer 110 that includes landing pads 115 that are distributed throughout one side 120 (e.g., a top side or bottom side) of the IC 105.

The IC 105 can comprise conventional active components 122 (e.g., transistors) or passive components 124 (e.g., resistors, inductors or capacitors) formed in or on a substrate 126 (e.g., silicon, silicon-germanium or gallium arsenide wafers) in a front-end-of-line (FEOL) fabrication process of the IC. E.g., active components 122 comprising one or more nMOS or pMOS transistors, CMOS devices, or bipolar active devices can be formed in or on a silicon substrate 126 using photolithographic, deposition, doping, planarization and other FEOL techniques well known to those skilled in the art. The IC 105 can comprise one or more circuits for a radiofrequency (rf) amplifier, a modem, a program control, memory, and the like.

The term landing pad as used herein refers to a interconnect structure formed as part of a back-end-of-line (BEOL) process to construct the IC. The landing pad 115 is configured to couple the active and passive components 122, 124 to electrical components 130 that are external to the IC 105. E.g., the landing pads 115 provide sites of electrical connection for conductive lines 135 (e.g., wires) of the device 100. The conductive lines 135 connect the landing pads 115 to the external electrical components 130.

The term distributed, as used herein, refers to a uniform placement of the land pads 115 over all regions of the side 120 to be coupled to the external electrical components 130. This is in contrast to conventional ICs, which have bond pads that are peripherally located on their uppermost layer. E.g., for the example device 100 shown in FIG. 1A, active and passive components 122, 124 of the IC 105 can be coupled to, and located directly under, the landing pads 115. That is, there is no RDL to redirect peripherally located bonding pads to more central locations over the IC 105.

In some embodiments, the landing pads 115 are homogenously distributed throughout the side 120. A homogenous distribution of landing pads 115 advantageously maximizes the space available to place the conductive lines 135 between the land pads 115 (see e.g., FIG. 2). The term homogeneously distributed as used herein refers to any one 10 percent area of the side 120 having about the same number (e.g., within ±20 percent) of landing pads 115 as any other same-sized area of the side 120. E.g., a central region 210 not touching the perimeter of the IC's side 120, and occupying 10% of the total area of the side 120 will have about the same number of landing pads 115 as a same-sized area in a peripheral region 220 that does touch the perimeter of the IC's side 120 (FIG. 2).

The conductive lines 135 of the uppermost layer 110 can be configured so that each landing pad 115 contacts at least one conductive line 135 (FIGS. 1A and 2). The conductive lines 135 are thereby electrically connected to the landing pads 115, and hence the IC 105, to external components 130 the device 100. The external electrical components 130 can include RF devices, such as an amplifier or filter, or passive or active electrical devices, such as capacitors and transistors, or other components well know to those skilled in the art.

In some embodiments of the device 100, the uppermost layer 110 is a metal layer of the IC 105. E.g., the uppermost layer 110 can comprise a deposited layer of silicon dioxide or a low k material (e.g., dielectric constant of less than 3.9) that has been patterned using conventional photolithography to form openings that are then filled with a metal (e.g., copper) to form the landing pads 115, conductive lines 135 or other conductive structures. Alternatively, a blanket film of metal can be deposited, and then patterned and etched, to form the landing pads 115 or conductive lines 135.

The IC 105 can also comprise a plurality of layers that underlie the uppermost layer 110. E.g., the underlying layers can comprise insulating layers 140 and metal layers 145 that are also formed as part of the BEOL process. The metal layers 145 can include conductive lines, vias or other conventional interconnect structures formed in insulating layers. E.g., the landing pads 115 can be connected to the underlying active and passive components 122, 124 through interconnect 147 formed in the insulating layers 140 or metal layers 145. The interconnects 147 thereby couple the landing pads 115 to the metal layers 145 and to the active and passive components 122, 124 of the IC 105. Similar to the landing pads 115, the interconnects 147 in each one of the underlying layers (e.g., insulating or metal layers 140, 145) are preferably distributed throughout any one or all of the layers 140, 145. For ease of manufacture, it is preferable for the uppermost layer 110 and underlying metal layer 145 to be composed of the same metal (e.g., both copper).

In some embodiments of the device 100, the uppermost layer 110 is covered with an insulating coating 150 to protect and insulate the IC 105 and hold the IC 105 in place. The conductive lines 135 can be located on the insulating coating 150 and coupled to the landing pads 115 through the insulating coating 150. In some embodiments, the insulating coating 150 comprises a thin (e.g., about 100 to 200 micron) coat of epoxy deposited over the uppermost layer 110. The use of a transparent coating 150 is desirable because this facilitates identification of the locations of underlying landing pads 115. The landing pads 115 can be exposed by forming openings in the insulating coating 150, e.g., by laser drilling, so that the conductive lines 135 can contacted the landing pads 115.

The device 100 can further include a base layer 165. In some embodiments the base layer comprises a printed wiring board (PWB) or printed circuit board (PCB) comprising a laminated stack of layers 170. The base layer 165 or its component layers 170 can each comprise an insulator 172 and conductive wire 174. E.g., a conductive foil laminated to the insulator 172 can be patterned and etched to form wires 174 that interconnect the electrical components 130 to each other or to components external to the device 100. Conductive vias 176 formed through the insulator 172 facilitate these interconnections.

Preferred embodiments of the insulator 172 are made of plastic, such as epoxy-fiberglass, polyimidearramid, or similar resin-fiber combinations, used for printed circuit boards. In some embodiments the insulator 172 comprises FR-4™, a flame retardant epoxy-based material well known to those skilled in the art, and the wires 174 and vias 176 comprise copper. Other embodiments of the wires 174 and vias 176 comprise other metals such as aluminum, gold, silver, or alloys thereof, or non-metal conductors, or combinations thereof.

The base layer 165 is preferably a non-planar base layer because at least one major surface 180 of the layer 165 has at least one opening 182 therein. The opening 182 is configured to hold the IC 105. The IC 105 is positioned within the opening 182 such that the side 120 of the IC 105 having the landing pads 115 is exposed to the surface 180. It is preferable for the surface 120 of the uppermost layer 110 to be flush (e.g., the surfaces 120, 180 are within about 10 microns of each other) with the surface 180 of the base layer 165 because this facilitates the formation of the conductive lines 135.

The advantage of using a non-planar base layer 165, with an opening 182 able to accommodate the IC 105 is that the device 100 will have a smaller vertical profile, thereby allowing a smaller device to be constructed. It is desirable to have an underfill 184 in the opening 182, between the IC 105 and base layer 165 to reduce the strain between IC 105 and base layer 165. Preferred embodiments of the underfill 184 comprise an insulator such as epoxy.

The device 100 can comprise solder balls 186 on a second major surface 188 opposing the first surface 180 to facilitate the connection of the IC 105, and more generally the device 100, to one or more external device. The solder balls 186 can be configured to facilitate ball bonding, flip-chip, ball grid arrays, or similar attachment technologies. In still other cases, instead of, or in addition to the solder balls 186, the second surface 188 has external components 130 that are connected to the IC 105 through the conductive wire 174 and vias 176 (see e.g. FIG. 1B). Alternatively, embodiments of the device 100 can comprise edge connectors 230 (FIG. 2) to facilitate the connection of the device 100 to other devices.

One of ordinary skill in the art would appreciate that there are various ways that the device 100 could be assembled. E.g., in some embodiments, such as illustrated in FIG. 1A, the IC 105 is positioned within the opening 182 such that the side 120 having the landing pads 115 is exposed to the layer's first major surface 180 (FIG. 1A).

In other embodiments, the IC 105 is positioned within the opening 182 such that the side 120 having the landing pads 115 is at the bottom of the opening 182 (FIG. 1C). The landing pads 115 therefore are not exposed to the layer's surface 180. In some cases, as shown in FIG. 1C, the IC 105 is entirely encased inside of the base layer 165. In some embodiments, the landing pads 115 contact solder balls 190 located inside of, and at the bottom of, the opening 182. For the embodiment shown in FIG. 1C, these internal solder balls 190 are connected to the external components 130 or external solder balls 186 through the conductive wire 174 and vias 176.

The device can also comprise various combinations of the devices 100 such shown in FIG. 1A-1C. E.g., the device can comprise two devices such as depicted in FIG. 1A connected together such that their landing pads 115 are exposed on both major surfaces 180, 188 of the device. E.g., the devices 100 can be connected via their respective solder balls 186 (FIG. 1D). Alternatively, two devices without solder balls can be laminated together via their component layers 170 (FIG. 1E). In still other cases the solder balls 186 of one device can contact the landing pads 115 of another device (FIG. 1F). One skilled in the art would appreciate that the above examples are for illustrative purposes, and are not exhaustive of the various combinations that are within the scope of the invention. E.g., a device 100 configured as depicted in FIG. 1A or 1B can be connected to a device 100 configured as depicted in FIG. 1B.

Some embodiments of the device 100 are configured as a mobile electrical device or a module of a mobile electrical device. Some mobile electrical devices 100 of the invention are configured to send and receive radiofrequency signals. The device 100 can send or receive the radiofrequency signals through wires or wirelessly. Examples include cellular phones, pagers, Global Positioning System (GPS) locators, moving picture expert group audio layer-3 (MP3) players, or radio or television receivers. Other mobile electrical devices of the invention are configured as cameras, watches, or similar portable devices.

E.g., turning to FIG. 1A, the base layer 165 can be configured as a PCB or PWB and the mobile electrical device 100 can comprise a plurality electronic components 130 mounted to the surface 180 of the base layer 165. The electronic components 130 can comprise one or more RF devices (radio transceiver, digital base band modem) power amplifiers, SAW filter, or other components well know to those skilled in the art, such as crystal oscillators, switches, antennas, voltage regulators, or battery monitors.

The device 100 also comprises at least one IC 105 configured as described above. That is, the IC 105 has an uppermost layer 110 that includes landing pads 115 that are distributed throughout one side 120 of the IC 105. The IC 105 can be configured, e.g., to control the device's 100 power management, perform GPS functions, serve as memory storage, or other functions. Conductive lines 135 contact the landing pads 115 to form an electrical connection between the IC 105 and one or more of the electrical components 130. The IC 105 can be mounted to a planar base layer 165 and more preferably is held within an opening 182 of the layer 165 such that the one side 120 is exposed to and is flush with the layer's surface 180. Positioning the IC 105 flush with the surface 180 facilitates the formation of the conductive lines 135 from the landing pads 115 to the external components 130. E.g., the conductive lines 135 can be formed as a continuous conductive structure on both of the IC's 105 side 120 having the pads 115 and the base layer's 165 surface 180 to connect the IC 105 to the electrical components 130.

Another aspect of the invention is a method of manufacturing an electrical device. Any of the embodiments of the electrical devices 100 discussed in the context of FIGS. 1A-1F and 2 can be manufactured by the method.

FIGS. 3-12 show selected steps in an example fabrication of an IC 305 of the electrical device 300. FIG. 3 shows the device 300 after using conventional FEOL processes to form active components 310 and passive components 315 of an IC 305 in or on a substrate 317 (e.g., a silicon wafer), and then using conventional BEOL processes to form metal layers 320 and insulating layers 325 over the active and passive components 310, 315. The metal and insulating layers 320, 325 can include interconnects 330 that form electrical connections within the IC 305. E.g., damascene or dual damascene processes well known to those skilled in the art can be used to form copper metal layers 320 and interconnects 330.

FIGS. 4-5 show selected steps in forming an uppermost layer of the IC 305. Forming the uppermost layer 410 can comprise blanket depositing a metal film 415 on one side 420 of the IC 305, using, e.g., electrochemical or electroless deposition procedures. As illustrated in FIG. 5, forming the uppermost layer 410 further comprises patterning and etching the film 415 to form landing pads 510.

Alternatively, the uppermost layer 410 can be formed as part of the same BEOL process as used to form the underlying metal and insulating layers 320, 325. E.g., as illustrated in FIG. 6 forming the uppermost layer 410 can comprise e.g., depositing a layer of insulating material 610 on one side 420 over the active and passive components 310, 315 and underlying layers 320, 325 of the IC 305, and then patterning the insulating layer 610 to form openings 620 therein, e.g., using damascene or dual damascene processes). The openings 620 can then be filled with a conductive material to form the landing pads 510 (FIG. 7). E.g., electrochemical deposition can be used to fill the openings with copper, following by chemical mechanical polishing to planarize the side 420.

As discussed in the context of FIGS. 1-2, regardless of the fabrication process used, the landing pads 510 are distributed throughout the one side 420 of the IC 300. As further illustrated, the landing pads 510 are connected to interconnects 330 of the underlying layers 320, 325. The interconnects 330 in the underlying layers 320, 325 can also be distributed throughout any one or all of the underlying layers 320, 325.

FIG. 8 shows the device 300 after forming a base layer 810. The base layer 810 (e.g., a circuit board) can be formed by laminating a stack of layers 815 together. Laminating the stack of layers 815 together can comprise e.g., pressing together a plurality of adhesive-covered layers that comprise conventional circuit board material such as described above in the context of FIG. 1. FIG. 7 also shows the device after forming an opening 820 in a surface 825 of the base layer 810. E.g., forming the opening 820 can comprise photochemical machining or laser drilling the stack of layers 815.

FIG. 9 shows the device 300 after mounting the IC 305 to the base layer 810. In some embodiments, mounting the IC 305 comprises placing the IC 305, such as the IC 305 shown in FIG. 5, within the opening 820 such that the one side 420 having the landing pads 510 is exposed to the surface 825 of the base layer 810 (FIG. 8). That is, the side 420 faces the surface 825. In other embodiments, the IC 305 can be mounted by placing the IC 305 within the opening 820 such that the one side 420 faces away from the surface 825 (e.g., FIG. 1C). In some cases mounting the IC 305 can further comprises filling the opening 820 not occupied by the IC 305 with an under fill 905.

FIGS. 10-12 show selected steps in forming conductive lines on the uppermost layer 410 such that the conductive lines contact the landing pads 510. FIG. 10 shows the device 300 after covering the uppermost layer 410 with an insulating coating 1010 (e.g., expoxy). FIG. 10 also shows the device 300 after forming openings 1020 in the insulating coating 1010 directly over the landing pads 510, e.g., by laser drilling.

Figure 1A:
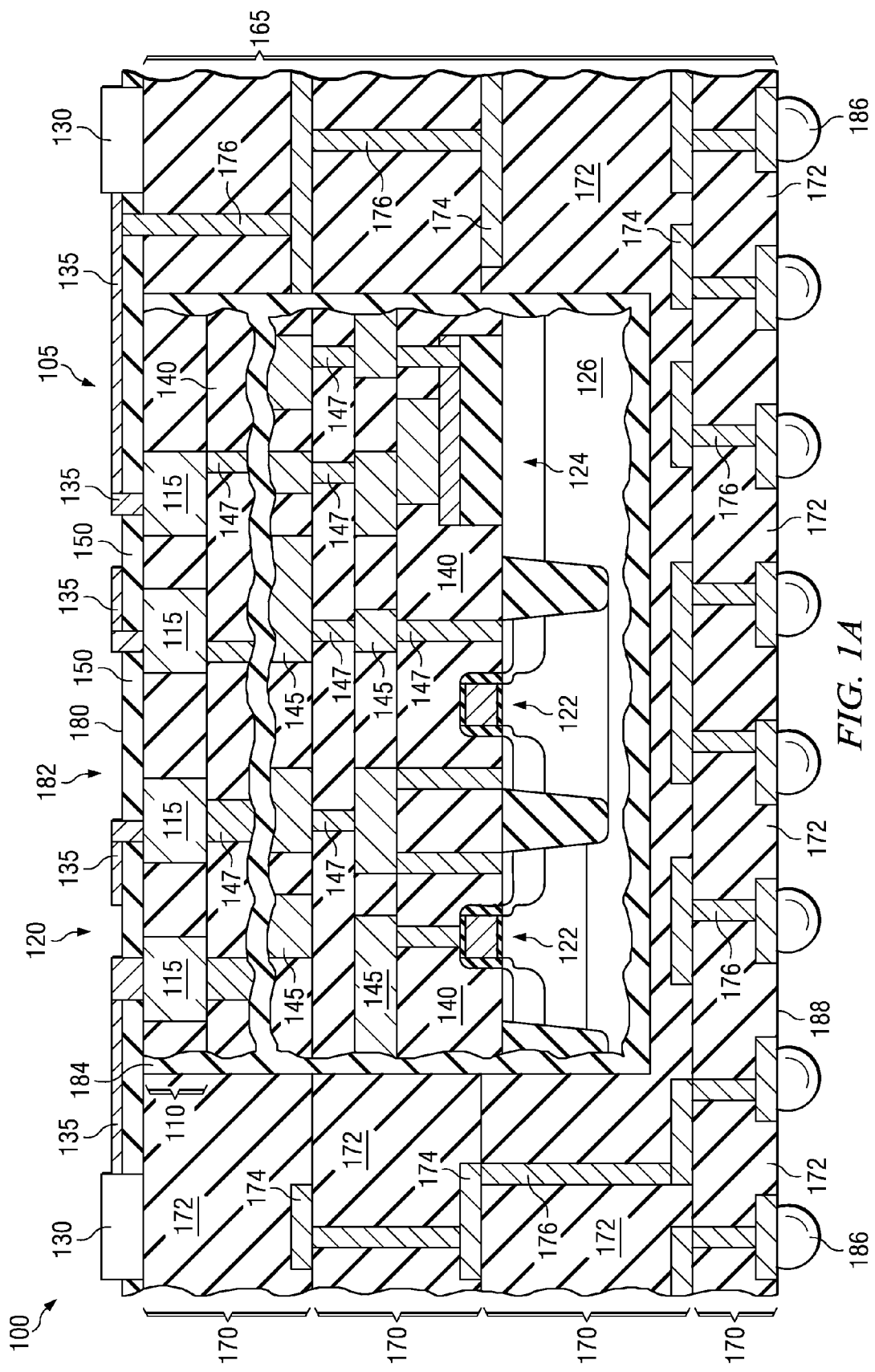
Figure 1B:
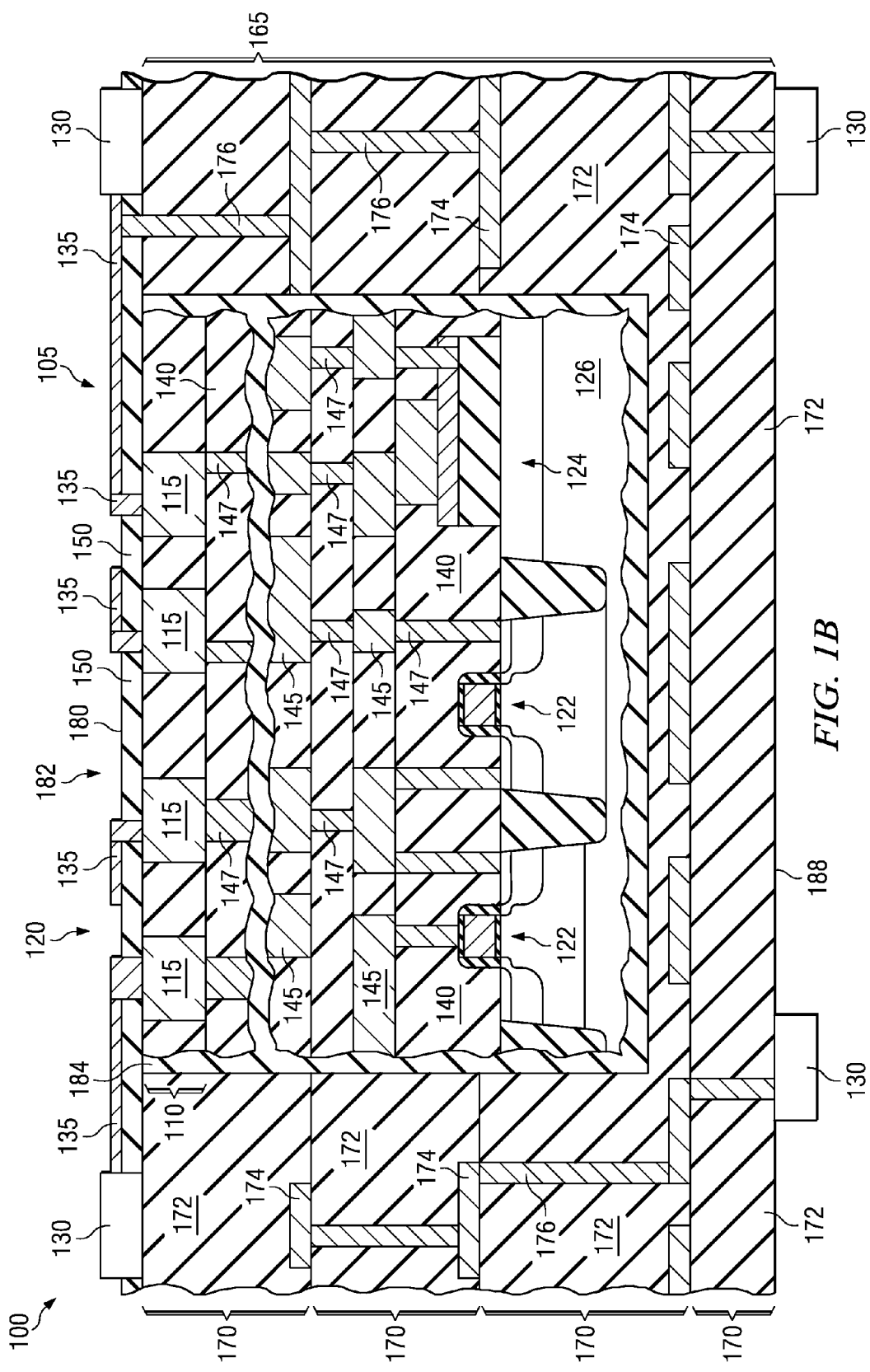
Figure 1C:
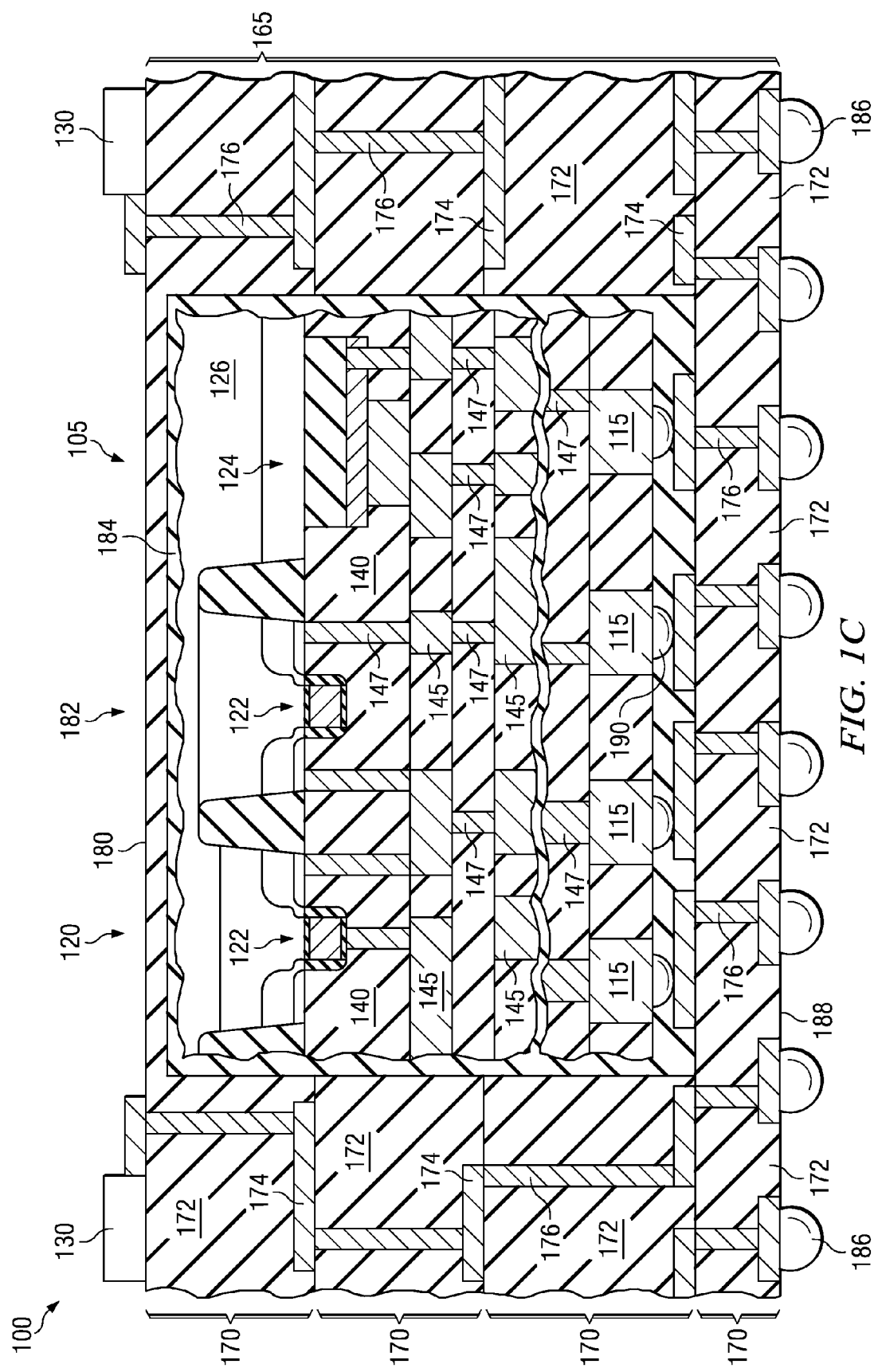
Figure 1D:
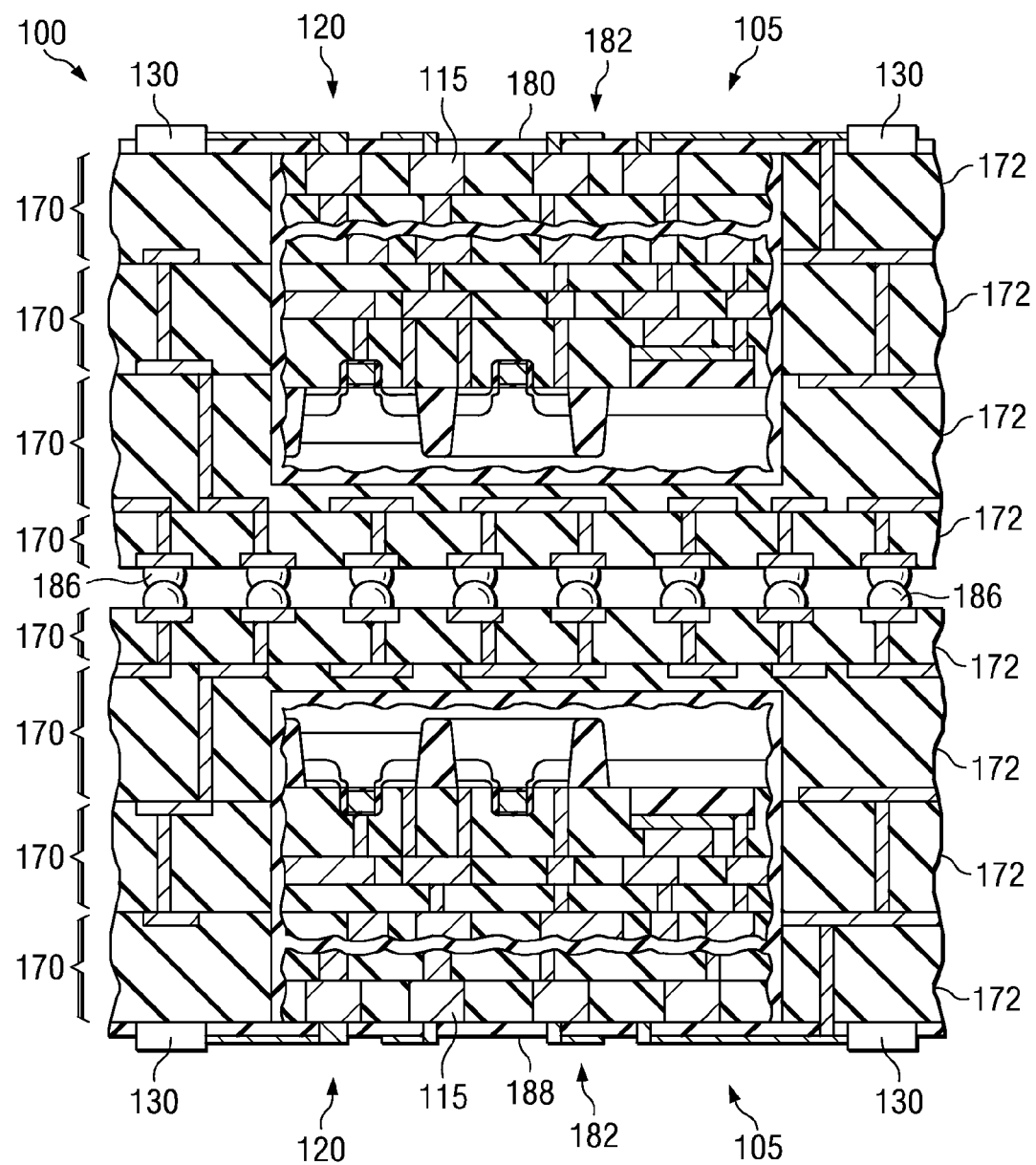
Figure 1E:
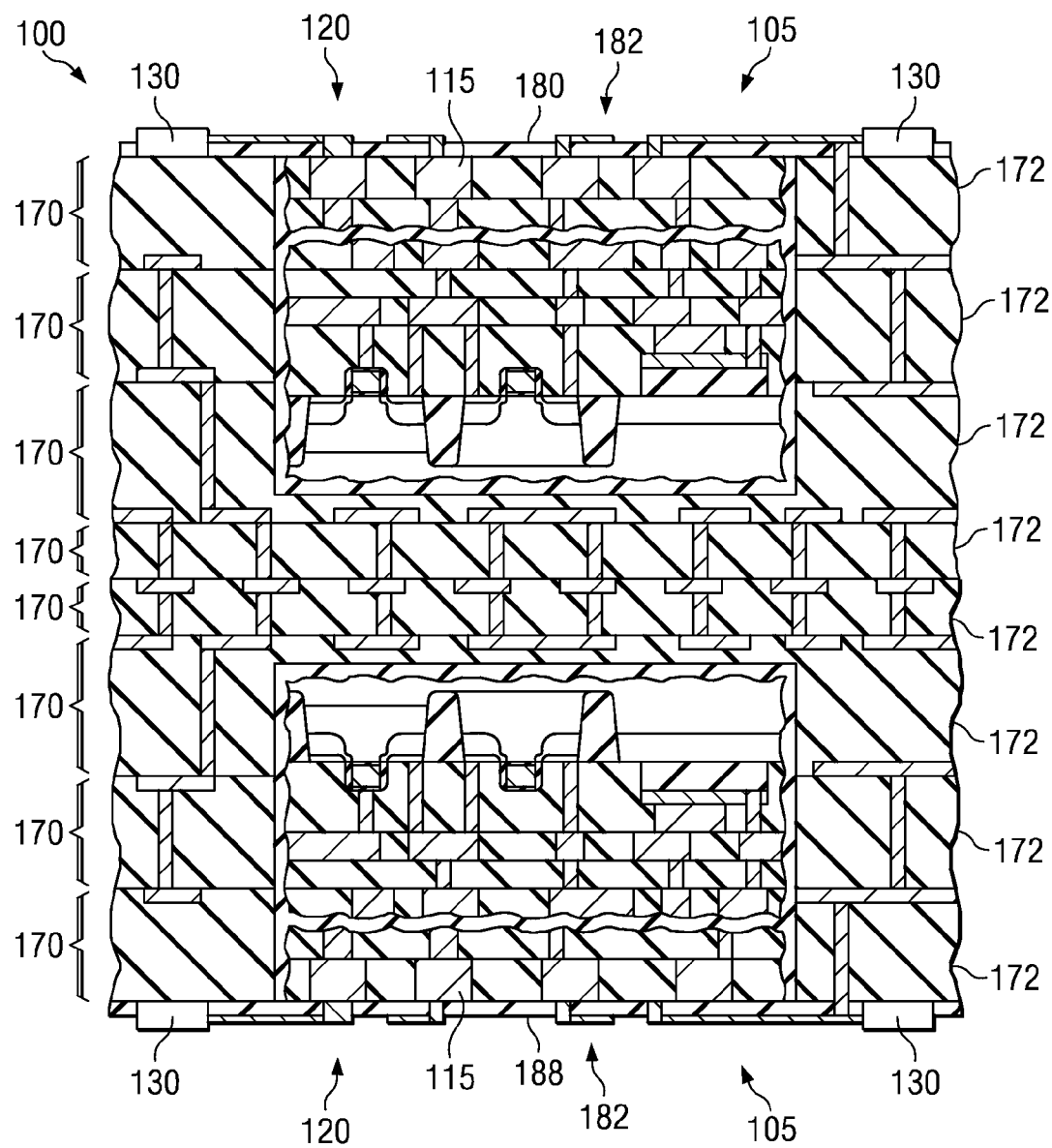
Figure 1F:
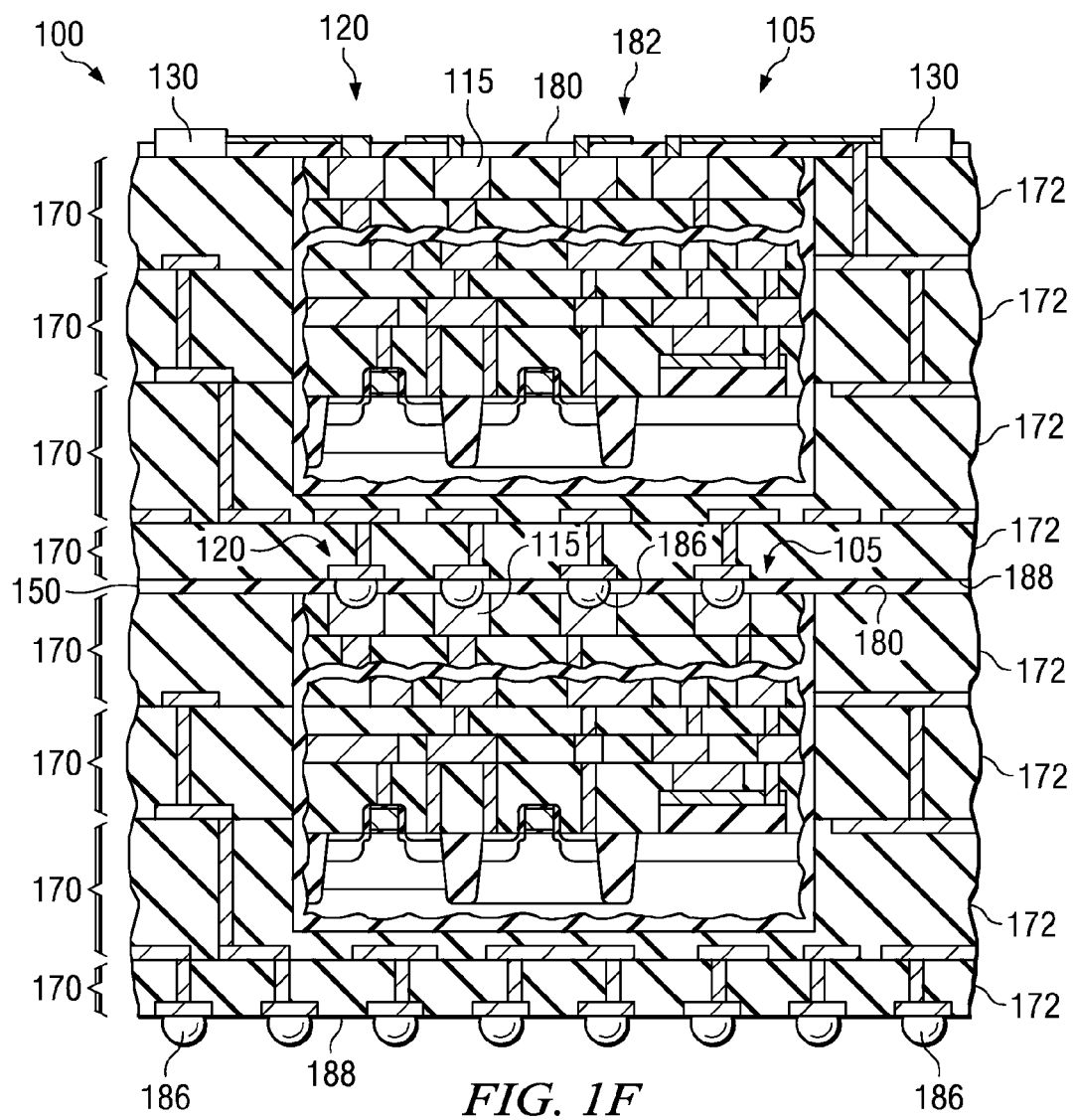
Figure 2:
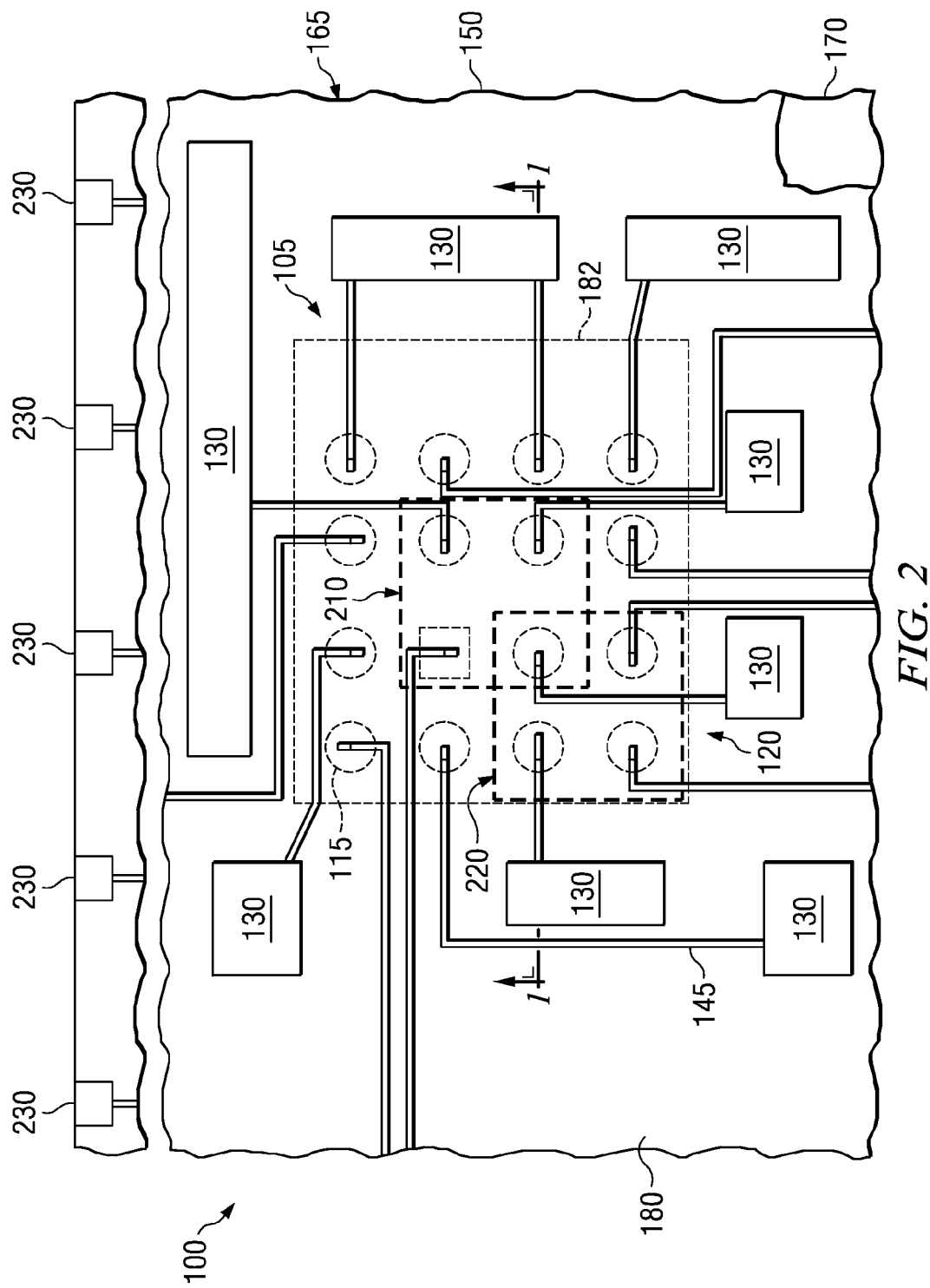
Figure 3:
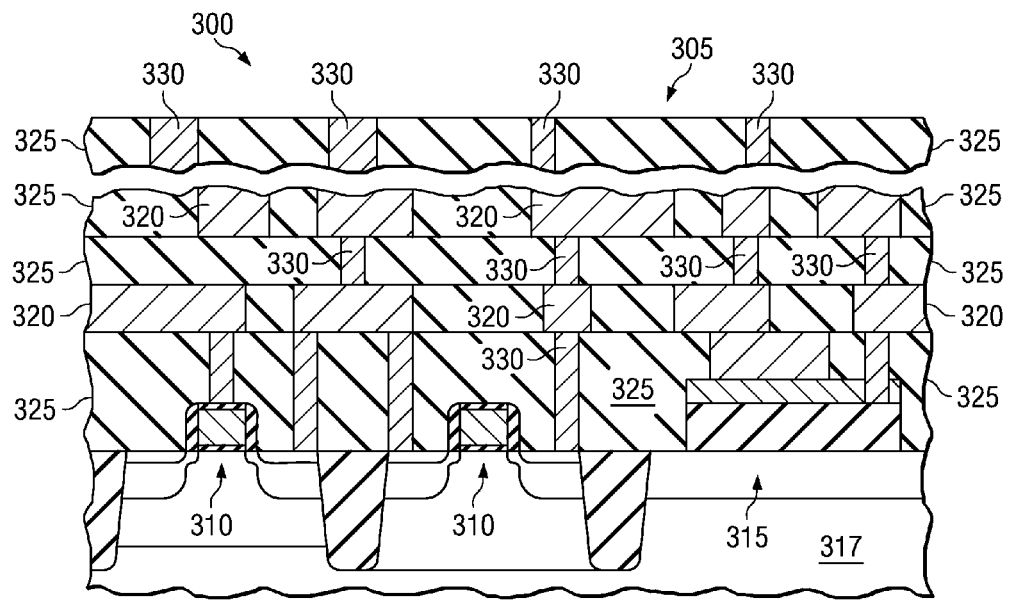
Figure 4:
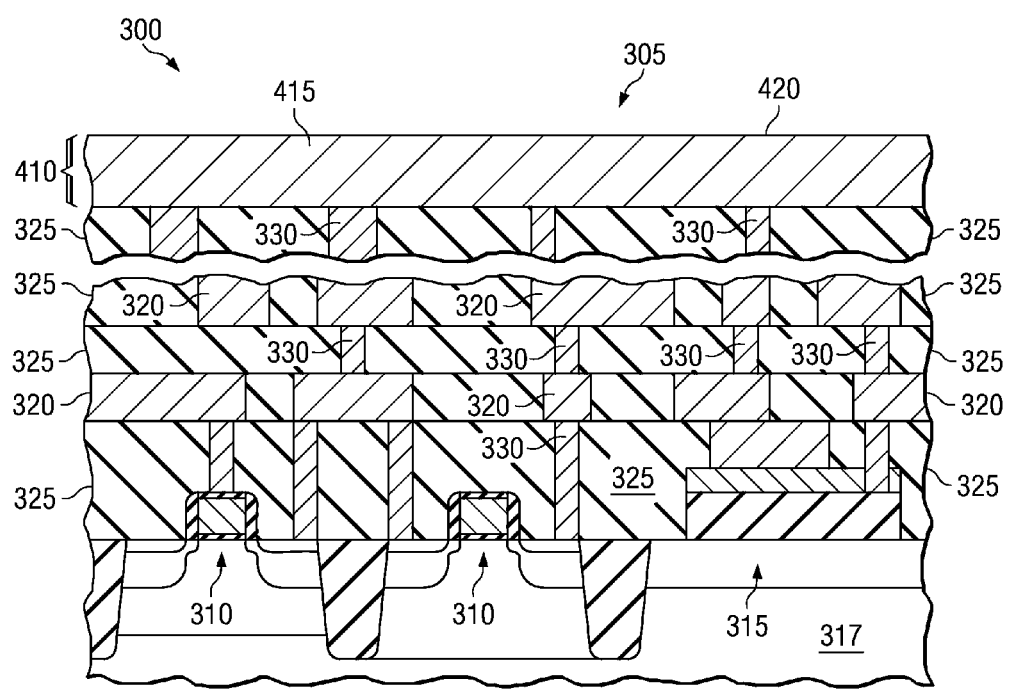
Figure 5:
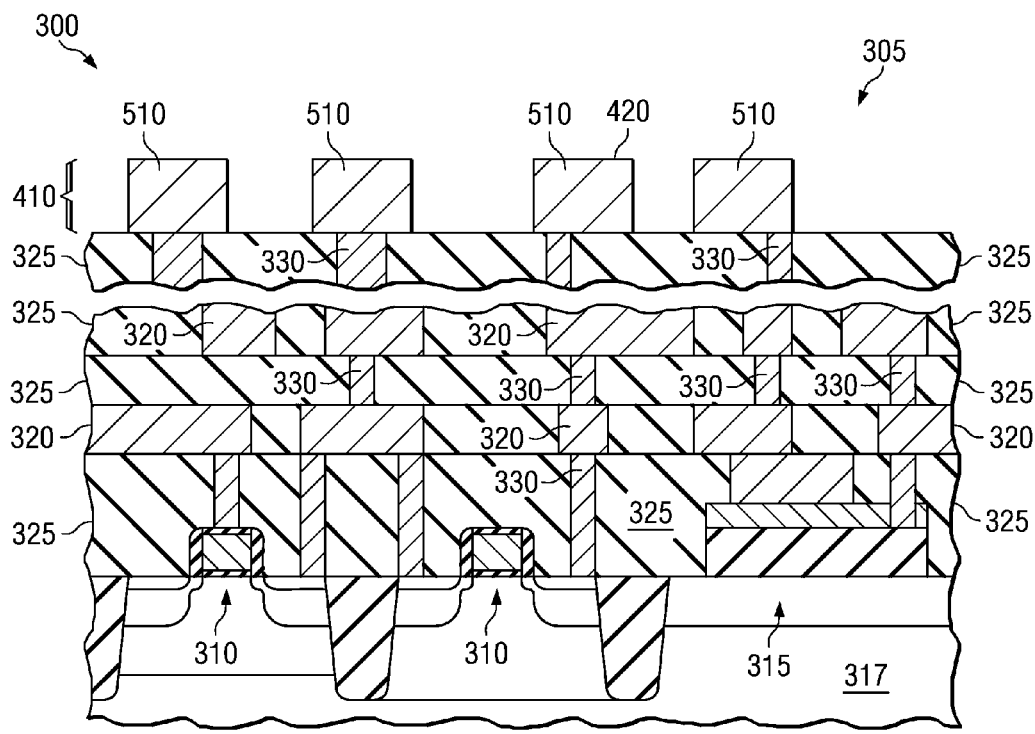
Figure 6:
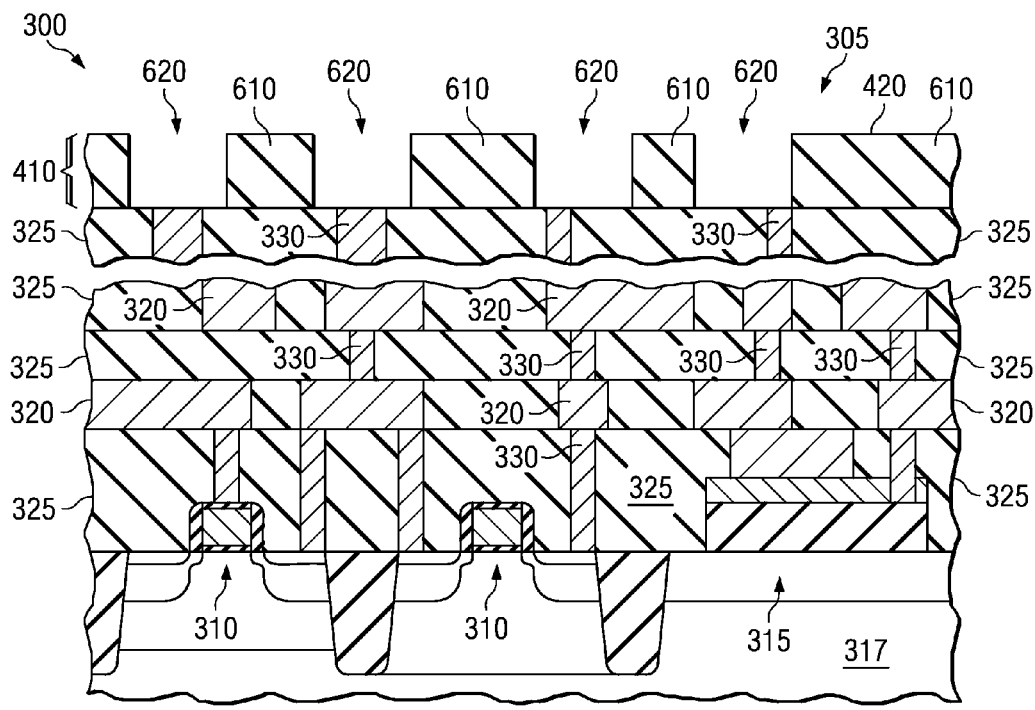
Figure 7:
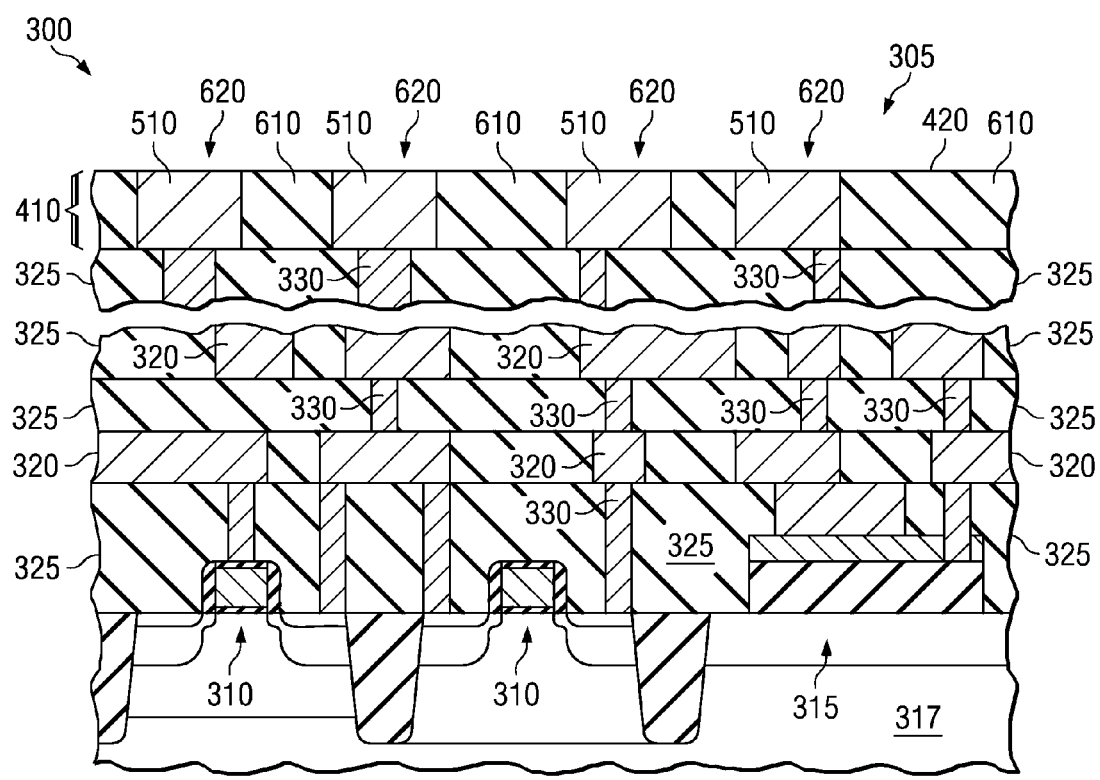
Figure 8:
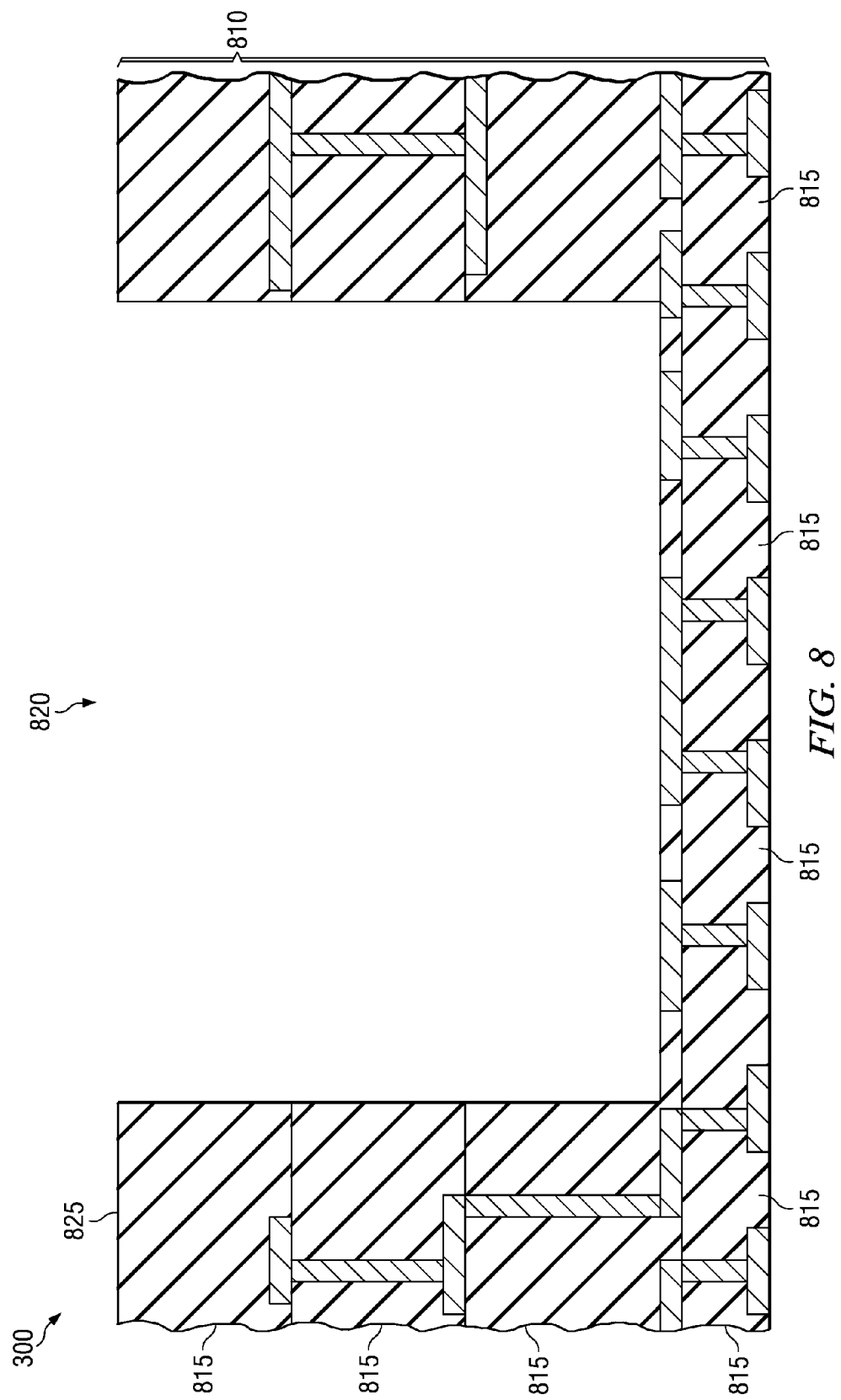
Figure 9:
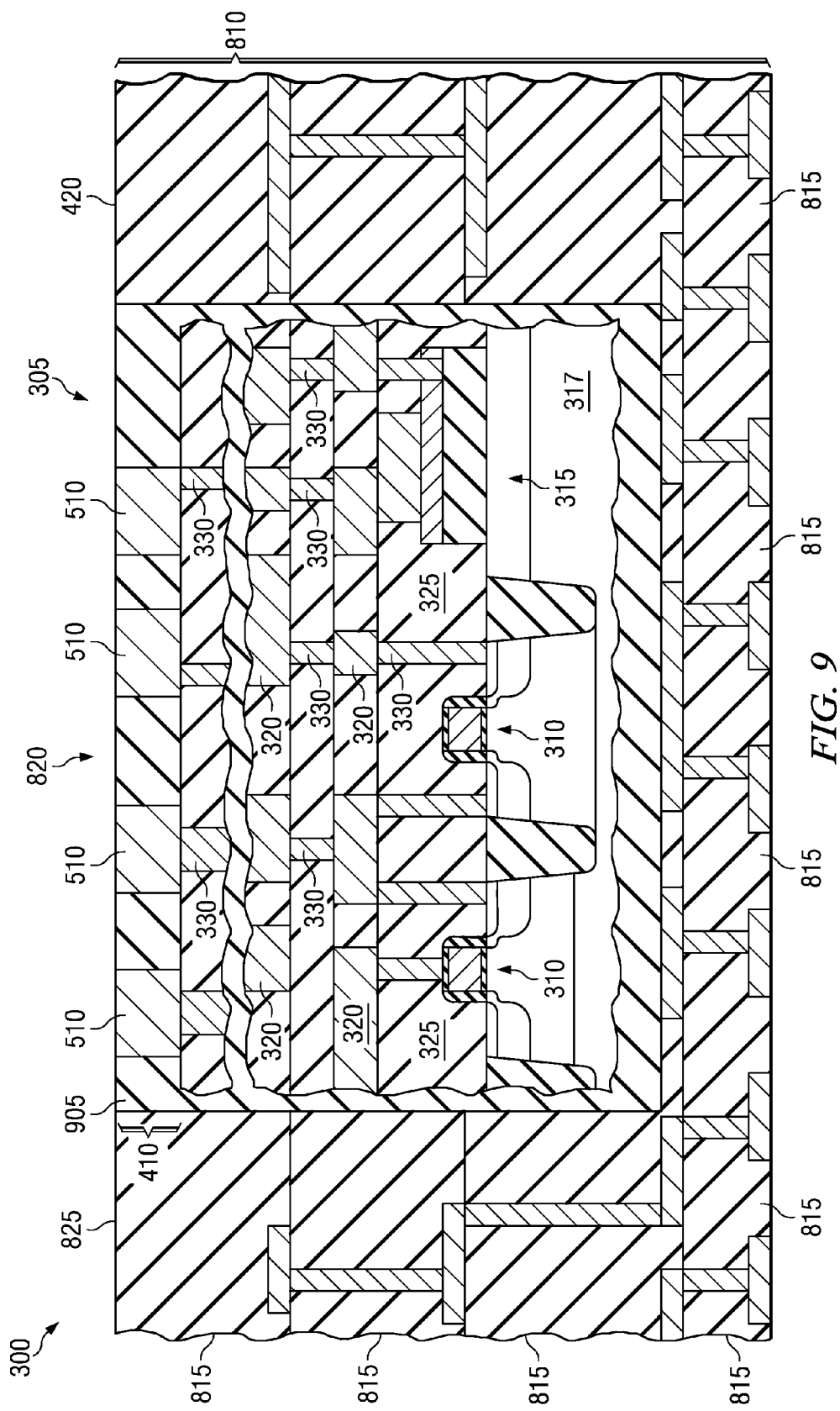
Figure 10:
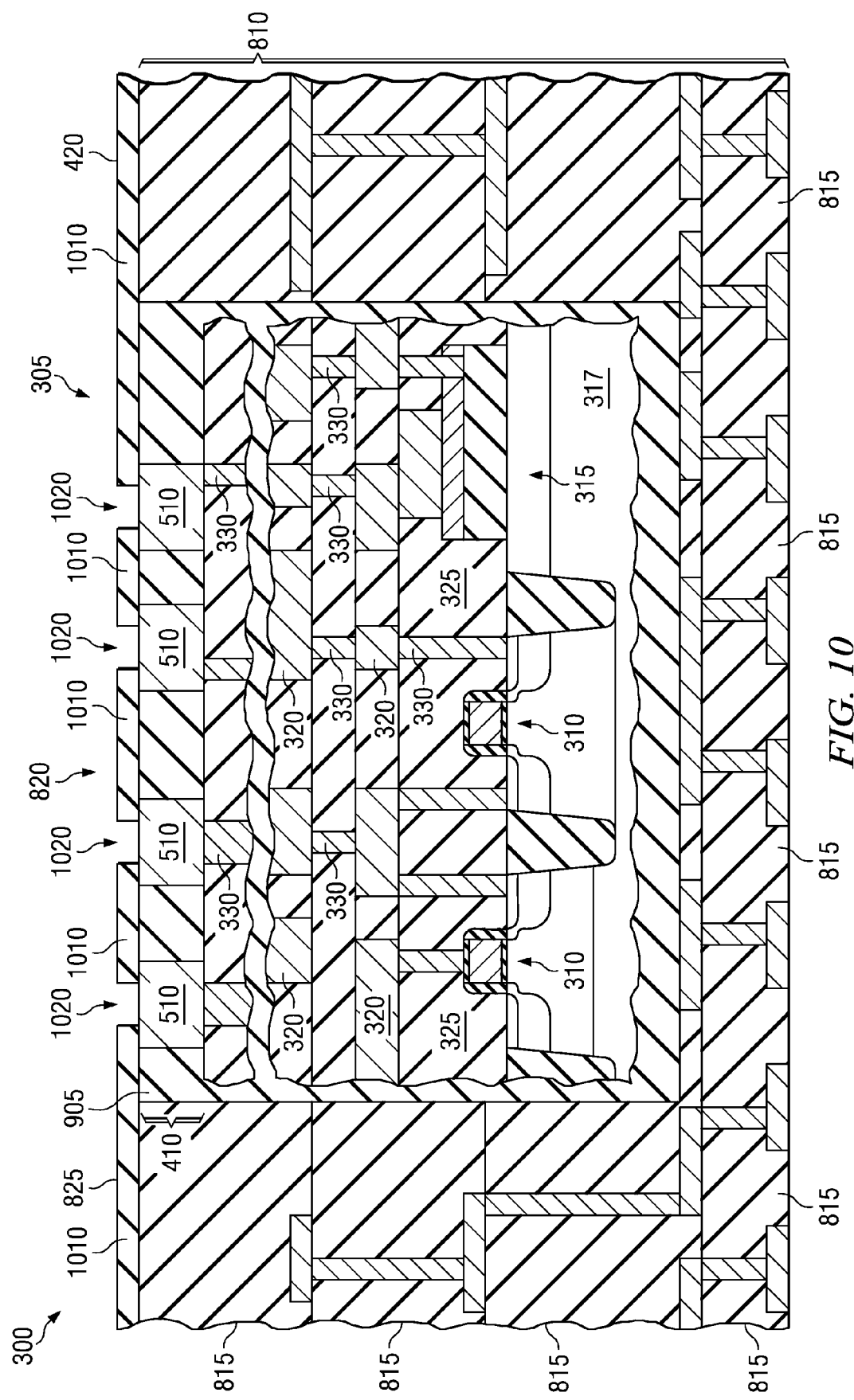
Figure 11:
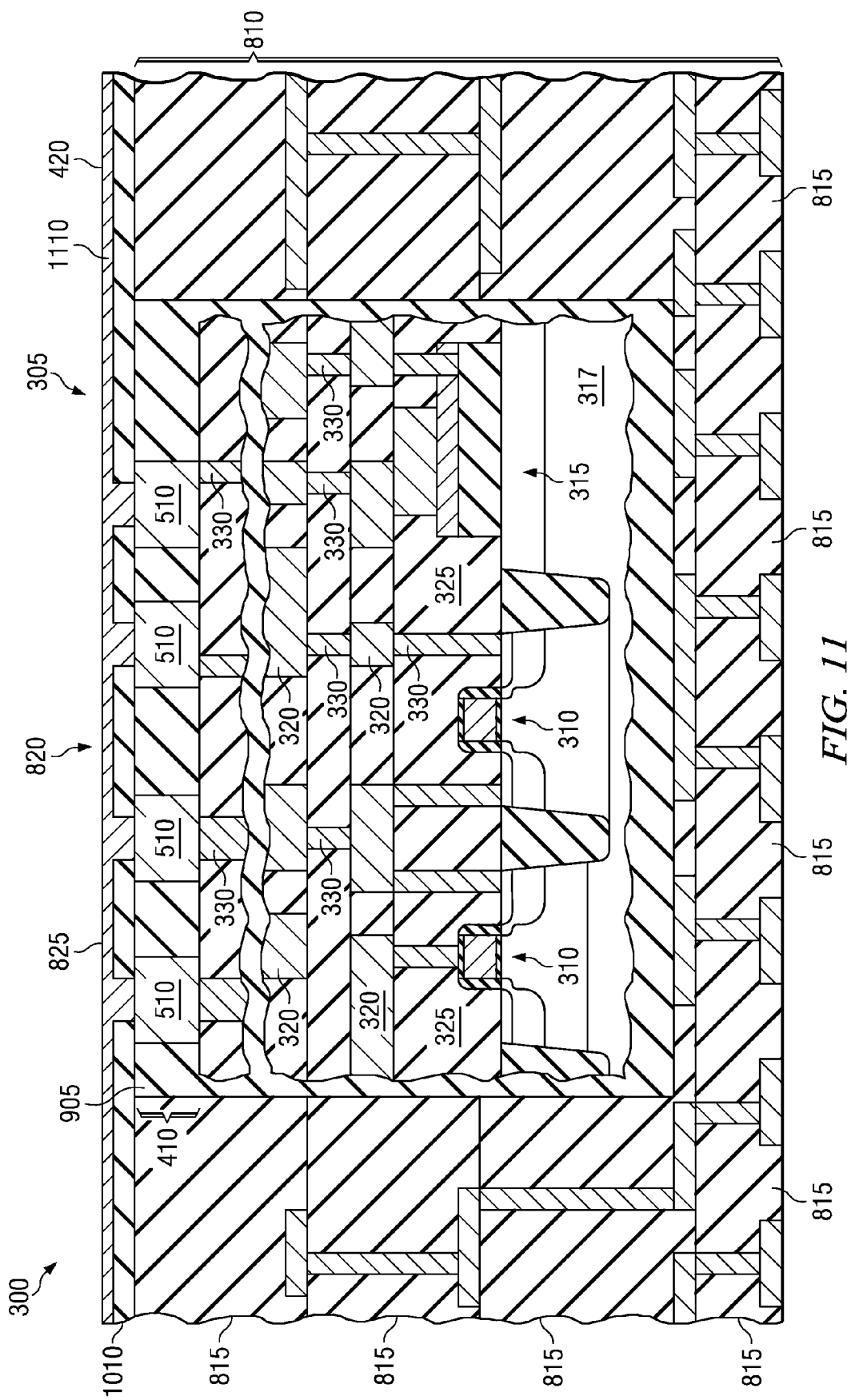
FIG. 11 shows the device 300 after covering the insulating coating 1010 with a metal layer 1110. E.g., the metal layer 1110 can comprise copper plated on the coating 1010 and into the openings 1020 (FIG. 10) using electroless deposition procedures well known to those skilled in the art.
Figure 12:
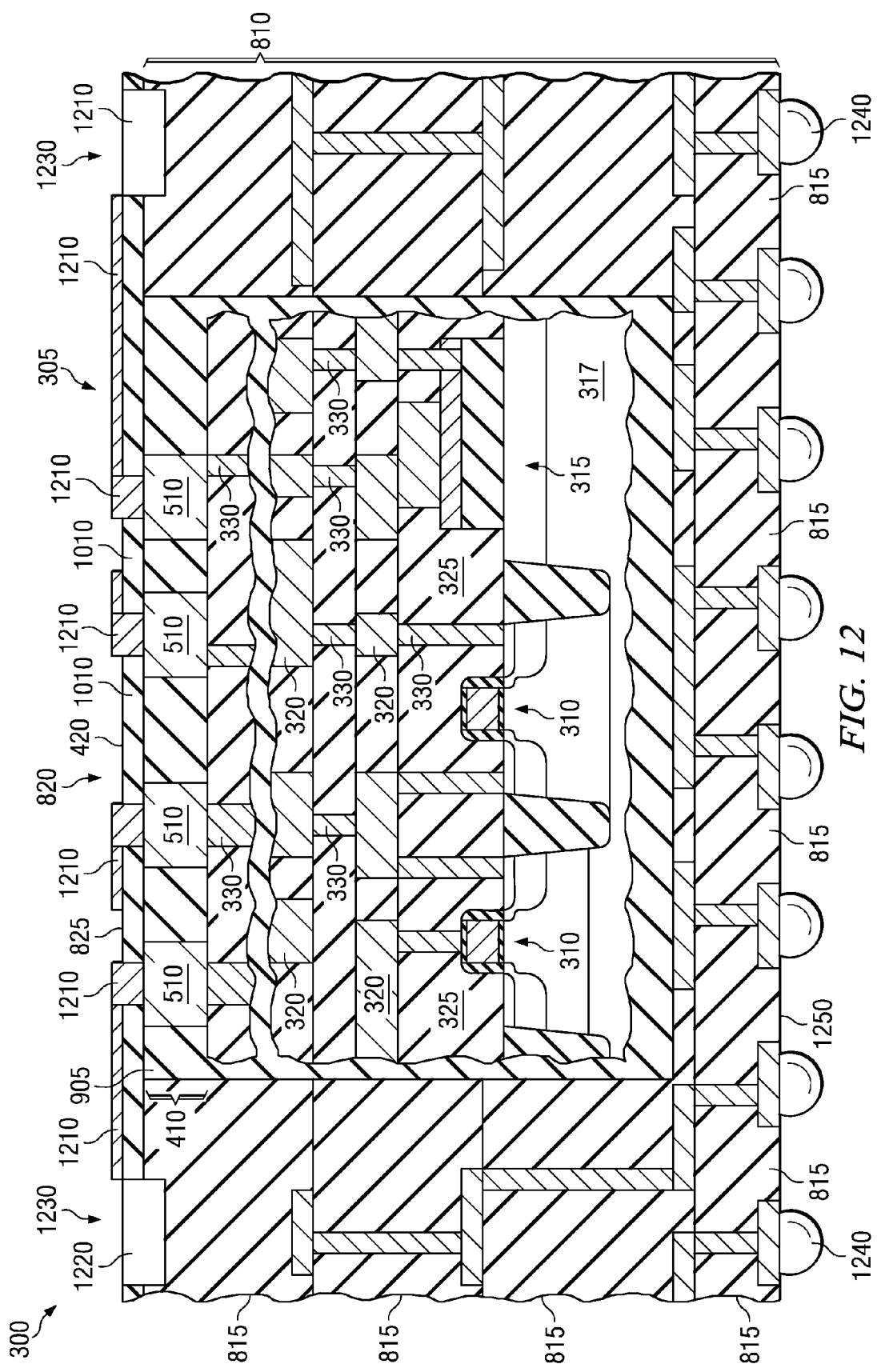
FIG. 12 shows the device 300 after using conventional methods to pattern and etch the metal layer 1110 (FIG. 11) to form conductive lines 1210 on the insulating coating 1010 and in the openings 1020 (FIG. 10).

As also shown in FIG. 12, other electrical components 1220 can be mounted to the base layer 810. The electrical components 1220 can be coupled to the IC 305 via conductive lines 1210. In some cases one or more of the electrical components 1220 can be mounted inside of openings 1230, formed similar to that described above for mounting the IC 305, to advantageously reduce the vertical profile of the device 300. Additionally, solder balls 1240 can be connect to a second major surface 1250 opposing the first surface 825 to facilitate the connection of the IC 305, and more generally the device 300, to one or more external device.

Although the present invention has been described in detail, those skilled in the art should understand that they could make various changes, substitutions and alterations herein without departing from the scope of the invention in its broadest form.

The invention claimed is:

1. An electrical device, comprising:
 a base layer having a void therein;
 an integrated circuit (IC) within the void, said IC having an uppermost layer that includes landing pads that are homogenously distributed throughout one side of said IC;
 an electrical component on a surface of said base layer; and
 a conductive line connecting said electrical component to one of said landing pads of said IC.

2. The device of claim 1, wherein said homogenous distribution is not accomplished via a redistribution wiring layer (RDL).

3. The device of claim 1, wherein active and passive components of said IC are coupled to, and are located directly under, said landing pads.

4. The device of claim 1, wherein said uppermost layer is a metal layer of said IC.

5. The device of claim 1, wherein said landing pads are connected to interconnects of one or more underlying layers of said IC, wherein said interconnects are distributed throughout said underlying layer.

6. The device of claim 1, wherein said uppermost layer is covered with an insulating coating.

7. The device of claim 6, wherein said IC includes conductive lines located on said insulating coating and coupled to said landing pads through said insulating coating.

8. The device of claim 1, wherein said base layer comprises a laminated stack of layers.

9. The device of claim 8, wherein said IC is positioned within said void such that said uppermost layer is exposed to said surface of said base layer.

10. The device of claim 8, wherein said uppermost layer is flush with a surface of said base layer.

11. The device of claim 1, further including solder balls on a second surface of said base layer opposing said surface, wherein said solder balls electrically couple said IC to one or more external device.

12. The device of claim 11, further comprising at least one electrical contact on an exterior portion of said base layer other than said surface and second surface.

13. The device of claim 1, wherein each of said landing pads is an interconnect structure formed as part of a back-end-of-line (BEOL) process used to construct the integrated circuit (IC).

14. The device of claim 1, wherein said distributed landing pads are uniformly packed over all regions of said one side of said IC.

15. A mobile electrical device, comprising:
 a plurality of electronic components mounted to a surface of a base layer;
 an integrated circuit (IC) held in an opening of said base layer, wherein said IC has an uppermost layer that includes landing pads that are homogenously distributed throughout one side of said IC and are exposed to said surface of said base layer; and
 conductive lines formed on said base layer and said one side, wherein said conductive lines contact said landing pads to form an electrical connection between said IC and one or more of said electrical components.

16. The mobile electrical device of claim 15, wherein said homogenous distribution is not accomplished via a redistribution wiring layer (RDL).

17. A method of manufacturing an electrical device, comprising:
 forming a base layer having a void therein;
 fabricating an integrated circuit (IC), an uppermost layer of said IC having landing pads which are homogenously distributed throughout one side of said IC;
 positioning said IC with said void;
 positioning an electrical component on a surface of said base layer; and
 forming a conductive line connecting said electrical component to one of said landing pads of said IC.

18. The method of claim 17, wherein forming said uppermost layer comprises depositing an insulating layer over active and passive components of said IC, patterning said insulating layer to form openings therein, and filling said openings with a conductor to form said landing pads.

19. The method of claim 17, further including connecting said landing pads to interconnects in one or more underlying layers of said IC, wherein said interconnects are distributed throughout each of said underlying layers.

20. The method of claim 17, further including forming conductive lines on said uppermost layer such that said conductive lines contact said landing pads.

21. The method of claim 17, further including covering said uppermost layer with an insulating coating, forming openings in said insulating coating directly over said landing pads, and forming conductive lines on said insulating coating and in said openings.

22. The method of claim 17, further including:
 laminating a stack of layers together to form the base layer;
 forming an opening in a surface of said base layer, said opening configured to hold said IC; and
 mounting said IC to said base layer, wherein said IC is within said opening.

23. The method of claim 17, wherein said homogenous distribution is not accomplished via a redistribution wiring layer (RDL).

24. The method of claim 17, further including forming solder balls on a second surface of said base layer opposing said surface, wherein said solder balls electrically couple said IC to one or more external device.

25. The device of claim 24, further comprising forming at lest one electrical contact on an exterior portion of base layer other than said surface and second surface.

* * * * *